United States Patent
Zhao

(10) Patent No.: US 12,557,379 B2
(45) Date of Patent: Feb. 17, 2026

(54) LIGHT-EMITTING SUBSTRATE AND MANUFACTURING METHOD THEREOF

(71) Applicant: TCL CHINA STAR OPTOELECTRONICS TECHNOLOGY CO., LTD., Shenzhen (CN)

(72) Inventor: Yongchao Zhao, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/770,617

(22) PCT Filed: Mar. 29, 2022

(86) PCT No.: PCT/CN2022/083561
§ 371 (c)(1),
(2) Date: Apr. 20, 2022

(87) PCT Pub. No.: WO2023/173477
PCT Pub. Date: Sep. 21, 2023

(65) Prior Publication Data
US 2024/0145492 A1 May 2, 2024

(30) Foreign Application Priority Data
Mar. 16, 2022 (CN) .......................... 202210258122.5

(51) Int. Cl.
*H10D 86/01* (2025.01)
*H01L 25/16* (2023.01)
*H01L 21/768* (2006.01)

(52) U.S. Cl.
CPC ....... *H10D 86/0241* (2025.01); *H01L 25/167* (2013.01); *H01L 21/76862* (2013.01); *H01L 21/76864* (2013.01)

(58) Field of Classification Search
CPC .... H10D 86/0241; H10H 20/84; H10H 20/85; H10H 20/856; H10H 20/857;
(Continued)

(56) References Cited

U.S. PATENT DOCUMENTS 11,892,674 B2 * 2/2024 Deng ................ G02F 1/133608
2011/0181675 A1 * 7/2011 Takemoto .......... B41J 11/00244
347/102
(Continued)

FOREIGN PATENT DOCUMENTS

| CN | 103545438 | * 1/2014 | ........... H10H 20/856 |
| CN | 111584511 A | 8/2020 | |

(Continued)

OTHER PUBLICATIONS

PCT International Search Report for International Application No. PCT/CN2022/083561, mailed on Nov. 28, 2022, 8pp.
(Continued)

*Primary Examiner* — Mary A Wilczewski
(74) *Attorney, Agent, or Firm* — The Roy Gross Law Firm, LLC; Roy D. Gross

(57) ABSTRACT

A light-emitting substrate and a manufacturing method thereof are provided. The reactivity of part of the ink layer outside the preset area that is far from the light with the first preset wavelength is improved by a heating process. Thus, the part of the ink layer reacts sufficiently under irradiation of the light with the first preset wavelength at lower energy. This improves an undercut issue caused by insufficient curing of the ink layer outside the preset area far from the light with the first preset wavelength, thereby preventing the (Continued)

ink layer from being peeled off from the light-emitting substrate.

19 Claims, 4 Drawing Sheets

(58) Field of Classification Search
CPC .. H10H 20/0364; H10H 20/01; H10H 20/034; H10H 20/036; H01L 25/167; H01L 25/0753; H01L 21/76862; H01L 21/76864
See application file for complete search history.

(56) References Cited

U.S. PATENT DOCUMENTS

| | | | |
|---|---|---|---|
| 2018/0282559 A1* | 10/2018 | Umebayashi | C09D 11/322 |
| 2023/0168424 A1* | 6/2023 | Deng | G02B 6/0055 |
| | | | 362/615 |
| 2024/0145492 A1* | 5/2024 | Zhao | H10H 20/857 |

FOREIGN PATENT DOCUMENTS

| | | | | |
|---|---|---|---|---|
| CN | 111900194 A | | 11/2020 | |
| CN | 112997325 A | | 6/2021 | |
| CN | 113270437 | * | 8/2021 | ......... H01L 25/0753 |
| CN | 113270437 A | | 8/2021 | |
| CN | 113327919 A | | 8/2021 | |
| CN | 114141913 A | | 3/2022 | |
| JP | 2003-183551 | * | 7/2003 | ............. C09D 11/00 |
| JP | 2012059921 A | | 3/2012 | |
| KR | 101780793 | * | 9/2021 | ............ H10H 20/01 |
| TW | 200300962 A | | 6/2003 | |

OTHER PUBLICATIONS

PCT Written Opinion of the International Search Authority for International Application No. PCT/CN2022/083561, mailed on Nov. 28, 2022, 7pp.
Chinese Office Action issued in corresponding Chinese Patent Application No. 202210258122.5 dated Jul. 5, 2024, pp. 1-7, 17pp.

* cited by examiner

LIGHT-EMITTING SUBSTRATE AND MANUFACTURING METHOD THEREOF

CROSS REFERENCE TO RELATED APPLICATIONS

This application is a National Phase of PCT Patent Application No. PCT/CN2022/083561 having International filing date of Mar. 29, 2022, which claims the benefit of priority of Chinese Patent Application No. 202210258122.5, filed Mar. 16, 2022, the contents of which are all incorporated herein by reference in their entirety.

FIELD OF INVENTION

The present application relates to a field of display technology, and particularly relates to a light-emitting substrate and a manufacturing method thereof.

BACKGROUND OF INVENTION

Active sub-millimeter light-emitting diode displays have characteristics of high brightness, strong gray-scale performance, high color saturation, and high-definition dynamic image quality. In addition, they have the advantage of being easy to store and install, so they can replace traditional displays and projectors.

Active sub-millimeter light-emitting diode displays include a layer of white ink on a surface to resist scratches. However, the white ink is prone to peeling, which leads to a risk of interfacial corrosion on the active sub-millimeter light-emitting diode displays.

Therefore, it is necessary to propose a technical solution to solve the problem that the layer of white ink on the surface of the active sub-millimeter light-emitting diode display is prone to peeling.

Technical Problem

The purpose of the present application is to provide a light-emitting substrate and a manufacturing method thereof to solve the problem that the ink layer on the light-emitting substrate is prone to peeling.

SUMMARY OF INVENTION

A manufacturing method of a light-emitting substrate, including:
  providing an array substrate including a substrate and a conductive pad disposed on the substrate; forming an ink layer covering the conductive pad and the substrate, wherein the ink layer is defined with a preset area corresponding to a position of the conductive pad; irradiating the ink layer outside the preset area from a first side by light with a first preset wavelength while heating the ink layer outside the preset area from a second side, wherein the first side is one of a side of the substrate away from the ink layer or a side of the ink layer away from the substrate, and the second side is another one of the side of the substrate away from the ink layer or the side of the ink layer away from the substrate; removing the ink layer in the preset area to obtain a patterned ink layer; and bonding a light-emitting unit on the conductive pad to obtain the light-emitting substrate.

In some embodiments, the substrate is transparent, and the step of heating the ink layer outside the preset area from the second side includes: irradiating the ink layer outside the preset area from the second side by light with a second preset wavelength, wherein the second side is the side of the substrate away from the ink layer.

In some embodiments, the light with the first preset wavelength is the same as the light with the second preset wavelength.

In some embodiments, the first preset wavelength is greater than or equal to 365 nm and less than or equal to 450 nm, and the light with the first preset wavelength and the light with the second preset wavelength are both laser light.

In some embodiments, the light with the first preset wavelength is different from the light with the second preset wavelength, and the first preset wavelength is shorter than the second preset wavelength.

In some embodiments, the light with the first preset wavelength is laser light, and the light with the second preset wavelength is infrared light.

In some embodiments, after removing the ink layer in the preset area and before bonding the light-emitting unit on the conductive pad, the method further includes: cleaning the patterned ink layer.

In some embodiments, the ink layer is a white ink layer.

In some embodiments, the thickness of the ink layer is greater than or equal to 40 μm and less than or equal to 70 μm.

In some embodiments, after forming the ink layer covering the conductive pad and the substrate and before irradiating the ink layer outside the preset area from the first side by the light with the first preset wavelength, the method further includes: removing a solvent in the ink layer.

A light-emitting substrate, produced by the aforesaid manufacturing method of the light-emitting substrate.

Advantages

A light-emitting substrate and a manufacturing method thereof are provided. In the present application, using the light with the first preset wavelength to irradiate the ink layer outside the preset area from the first side, while heating the ink layer outside the preset area from the second side. The preset area is defined corresponding to the conductive pad. The first side is one of a side of the substrate away from the ink layer or a side of the ink layer away from the substrate, and the second side is another one of the side of the substrate away from the ink layer or the side of the ink layer away from the substrate. In this way, the reactivity of part of the ink layer outside the preset area that is far from the light with the first preset wavelength is improved by the heating process. Thus, the part of the ink layer reacts sufficiently under irradiation of the light with the first preset wavelength at lower energy. This can improve the undercut issue caused by the insufficient curing of the ink layer outside the preset area far from the light with the first preset wavelength, thereby preventing the ink layer from being peeled off from the light-emitting substrate.

DETAILED DESCRIPTION OF PREFERRED EMBODIMENTS

The technical solutions in the embodiments of the present application will be clearly and completely described below with reference to the drawings in the embodiments of the present application. Obviously, the embodiments are only part of the embodiments of the present application rather than all of the embodiments. Based on the embodiments in the present application, all other embodiments obtained by those skilled in the art without doing creative work fall within the protection scope of the present application.

Figure 1:
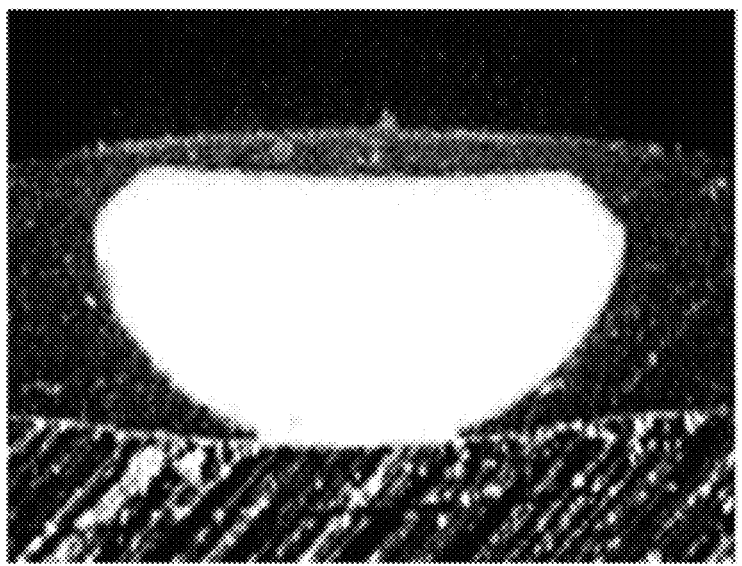
FIG. 1 is a schematic diagram showing that a bottom of a traditional white ink layer includes an undercut structure.

In view of the problem that the white ink layer is easily peeled off in the prior art, the inventor of the present application observed the peeled white ink layer. As shown in FIG. 1, the bottom of the peeled white ink layer includes an undercut structure (the white part in FIG. 1), in which the white ink layer is hollowed out. For this phenomenon, the inventor found through analysis that the undercut structure reduces the contact area between the white ink layer and the substrate. This causes the white ink layer to be easily peeled off from the substrate, that is, the presence of the undercut structure in the white ink layer causes the white ink layer to be easily peeled off.

Based on the above findings and analysis, the inventor further analyzed and found that the white ink layer in the undercut structure should be fully reacted and retained in a reaction stage. However, because the white ink layer in the undercut structure is not fully reacted in the reaction stage, it is removed during a development process. The white ink layer in the undercut structure does not fully react in the reaction stage because the white ink layer needs to be irradiated with short-wavelength light to be reacted. The white ink layer has a high reflectivity to light and the short-wavelength light has a weaker penetration ability in the white ink layer, which leads to a problem of insufficient reaction on the side of the white ink layer away from the short-wavelength light.

In view of this problem, the inventor of the present application proposes the following solution:

Using the light with the first preset wavelength to irradiate the ink layer outside the preset area from the first side, while heating the ink layer outside the preset area from the second side. The preset area is defined corresponding to the conductive pad. The first side is one of a side of the substrate away from the ink layer or a side of the ink layer away from the substrate, and the second side is another one of the side of the substrate away from the ink layer or the side of the ink layer away from the substrate. In this way, the reactivity of part of the ink layer outside the preset area that is away from the light with the first preset wavelength is improved by the heating process so that the part of the ink layer reacts sufficiently under irradiation of the light with the first preset wavelength at lower energy. This can improve the undercut issue caused by the insufficient curing of the ink layer outside the preset area away from the light with the first preset wavelength, thereby preventing the ink layer from being peeled off from the light-emitting substrate.

Figure 2:
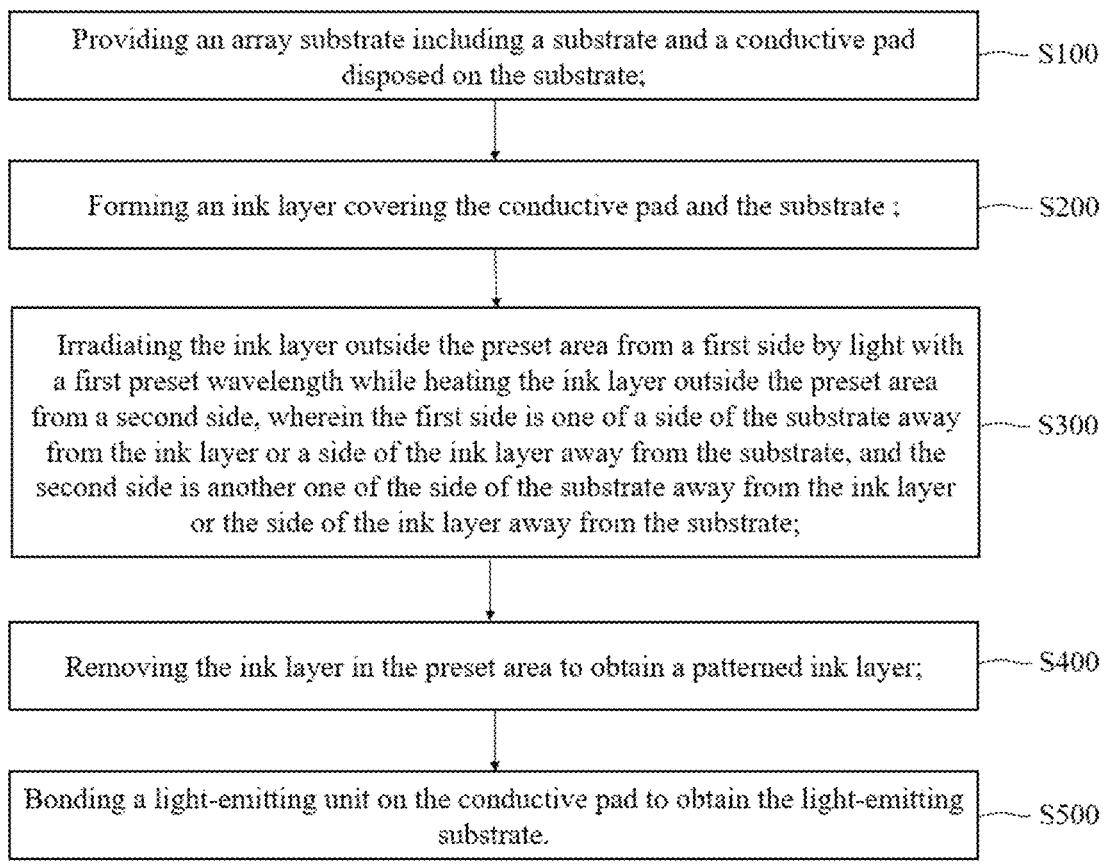
FIG. 2 is a schematic flowchart of manufacturing a light-emitting substrate according to an embodiment of the present application.

As shown in FIG. 2, the present application provides a manufacturing method of a light-emitting substrate, and the manufacturing method includes following steps: S100, providing an array substrate, where the array substrate includes a substrate and a conductive pad disposed on the substrate.

Figure 3A:
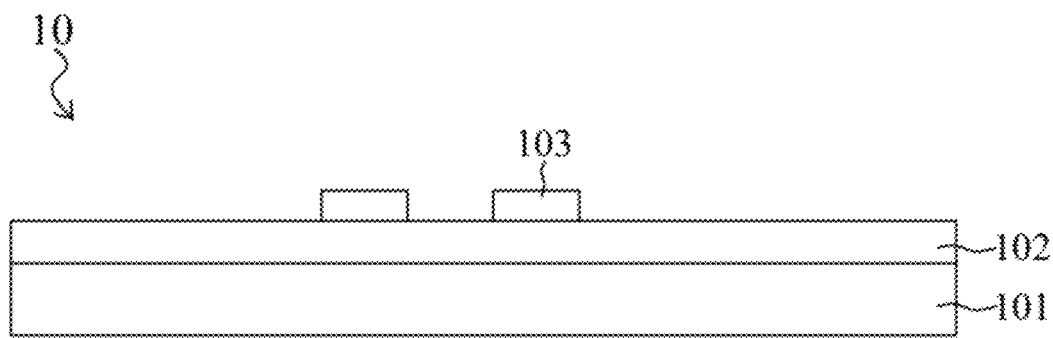
FIG. 3A-3F are schematic diagrams of a process of manufacturing a light-emitting substrate according to an embodiment of the present application.

Specifically, an array substrate 10 is provided. The array substrate 10 includes a substrate 101, a thin film transistor array layer 102, and a plurality of conductive pads 103. The thin film transistor array layer 102 is disposed on substrate 101, and a plurality of conductive pads 103 are disposed on the thin film transistor array layer 102, as shown in FIG. 3A.

Substrate 101 is transparent, for example, a transparent glass substrate. The thin film transistor array layer 102 includes a plurality of thin-film transistors, and the thin film transistors may be any of metal oxide thin-film transistors, polysilicon thin-film transistors, or amorphous silicon thin-film transistors. It can be understood that substrate 101 can also be a flexible transparent substrate, for example, the flexible transparent substrate can be a transparent polyimide substrate, a yellow polyimide substrate, or a transparent polyethylene terephthalate substrate.

At least one conductive pad 103 is electrically connected to the thin film transistor. The thickness of any of the plurality of conductive pads 103 is greater than or equal to 6000 angstroms and less than or equal to 10000 angstroms. The preparation material of the plurality of conductive pads 103 is selected from at least one of copper, molybdenum, aluminum, or silver.

S200, forming an ink layer covering the conductive pad and the substrate.

Figure 3B:
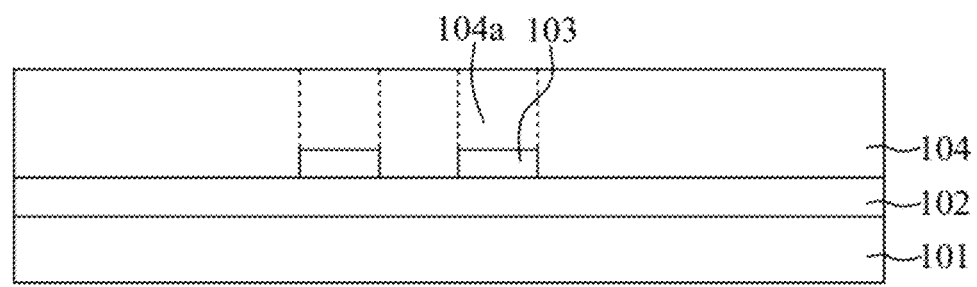

Specifically, an entire ink layer 104 is coated or printed on the array substrate 10, and the ink layer 104 covers the thin film transistor array layer 102 and the plurality of conductive pads 103, as shown in FIG. 3B. Following, the solvent in the ink layer 104 is removed by pretreatment, and the pretreatment condition is heating at a temperature ranges from 70 to 80 degrees Celsius for 25 to 35 minutes.

Wherein, ink layer 104 is a white ink layer. This enables the ink layer 104 to play a role in preventing the substrate circuit from being crushed or scratched in the subsequent process. Furthermore, the white ink layer plays a role in reflecting when the subsequently manufactured light-emitting substrate emits light, which improves the brightness of the light-emitting substrate and improves the light efficiency of the product.

The ink layer 104 includes a preset area 104a, and the preset area 104a is defined corresponding to the conductive pad 103. The ink layer 104 in the preset area 104a needs to be removed to expose the conductive pad 103 so that the subsequent light-emitting unit can be bonded to the conductive pad 103. The ink layer 104 outside the predetermined area 104a needs to be retained to prevent the substrate circuit from being crushed or scratched in the subsequent process.

The thickness of the ink layer 104 is greater than or equal to 40 μm and less than or equal to 70 μm to ensure the reflectivity of the ink layer 104. When the thickness of the ink layer 104 is less than or equal to 50 μm, the ink layer 104 can be formed by one-time coating or printing. When the thickness of the ink layer 104 is greater than 50 μm, the ink layer 104 is formed by two-times printings, so as to adapt to the performance of the current screen-printing equipment and the properties of the material of the ink layer 104.

The ink layer 104 is a photocurable ink so that the ink layer 104 has better precision after being patterned. For example, the preparation materials of the ink layer 104 include epoxy resin, acrylate, and a photo initiator. The reactivity of epoxy resin and acrylate improves under heating conditions, and both of them are beneficial to improve the reactivity and reaction speed of the photocuring reaction.

S300, irradiating the ink layer outside the preset area from a first side by light with a first preset wavelength while heating the ink layer outside the preset area from a second side, wherein the first side is one of a side of the substrate away from the ink layer or a side of the ink layer away from the substrate, and the second side is another one of the side of the substrate away from the ink layer or the side of the ink layer away from the substrate.

Specifically, the first mask 201 is placed on the side of the ink layer 104 away from the substrate 101. The first mask 201 is defined with a first light-transmitting area 201a and a first light-shielding area 201b, wherein the first light-shielding area 201b is defined corresponding to the preset area 104a, and the first light-transmitting area 201a corresponds to the area outside the preset area 104a. The second mask 202 is placed on the side of the substrate 101 away from the ink layer 104. The second mask 202 is defined with a second light-transmitting area 202a and a second light-shielding area 202b, wherein the second light-shielding area 202b is defined corresponding to the preset area 104a, and the second light-transmitting area 202a corresponds to an area outside the preset area 104a.

Figure 3C:
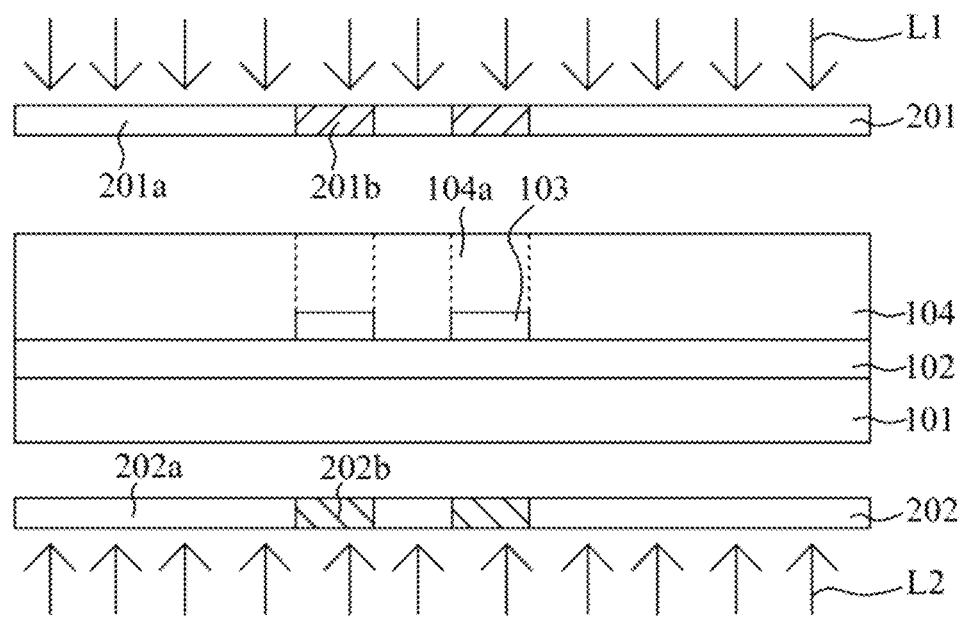

Following, while using the first light L1 with the first preset wavelength to pass through the first light-transmitting area 201a of the first mask 201 from the first side to irradiate the ink layer 104 outside the preset area 104a, the ink layer 104 outside the preset area 104a is heated from the second side by using the second light L2 with the second preset wavelength to pass through the second light-transmitting area 202a of the second mask 202. The first side is a side of the ink layer 104 away from the substrate 101, and the second side is a side of the substrate 101 away from the ink layer 104, as shown in FIG. 3C.

It can be understood that the first light L1 with the first preset wavelength can also be used to irradiate the ink layer 104 outside the preset area 104a from the second side through the second light-transmitting area 202a of the second mask 202, and the second light L2 with the second preset wavelength is used to heat the ink layer 104 outside the preset area 104a from the first side through the first light-transmitting area 201a of the first mask 201.

It should be noted that fiducial marks (not shown) are defined on the array substrate 10. An alignment imaging device is provided on the mechanism of the irradiation light source, and the alignment imaging device can precisely align the fiducial marks on the array substrate 10 so that the irradiation light source can accurately illuminate.

Wherein, the first light L1 with the first preset wavelength is used for curing the ink layer 104 except the preset area 104a, and the ink layer 104 of the preset area 104a that is not irradiated by the first light L1 with the first preset wavelength does not undergo curing reaction. The first preset wavelength is greater than or equal to 365 nm and less than or equal to 450 nm, for example, the first preset wavelengths are 375 nm, 380 nm, 390 nm, 400 nm, 410 nm, 420 nm or 430 nm. The first light L1 with the first preset wavelength is laser light, so that the first light L1 with the first preset wavelength has high energy, and the energy of the first light L1 with the first preset wavelength irradiating the ink layer 104 ranges from 800 mJ to 2000 mJ.

The reactivity is improved so that the ink layer outside the preset area that is far away from the part where the first light L1 with the first preset wavelength irradiates can be fully reacted by the irradiation of the first light L1 with the first preset wavelength at lower energy. This improves the undercut problem caused by insufficient curing of the ink layer outside the preset area away from the first light L1 with the first preset wavelength, thereby preventing the ink layer from peeling off the light-emitting substrate It can be understood that other heating methods can also be used for positioning heating.

The second light L2 of the second preset wavelength may be the same as or different from the first light L1 with the first preset wavelength. When the second light L2 of the second preset wavelength is the same as the first light L1 with the first preset wavelength, the second light L2 of the second preset wavelength is laser light with a wavelength greater than or equal to 365 nm and less than or equal to 450 nm. When the second light L2 with the second preset wavelength is different from the first light L1 with the first preset wavelength, the first preset wavelength is smaller than the second preset wavelength, so that while the second light L2 has a heating effect, the second light L2 has better penetration performance than the first light in the ink layer 104. For example, the second light L2 is infrared light, so the second light L2 has good heating characteristics.

S400, Removing the ink layer in the preset area to obtain a patterned ink layer.

Figure 3D:
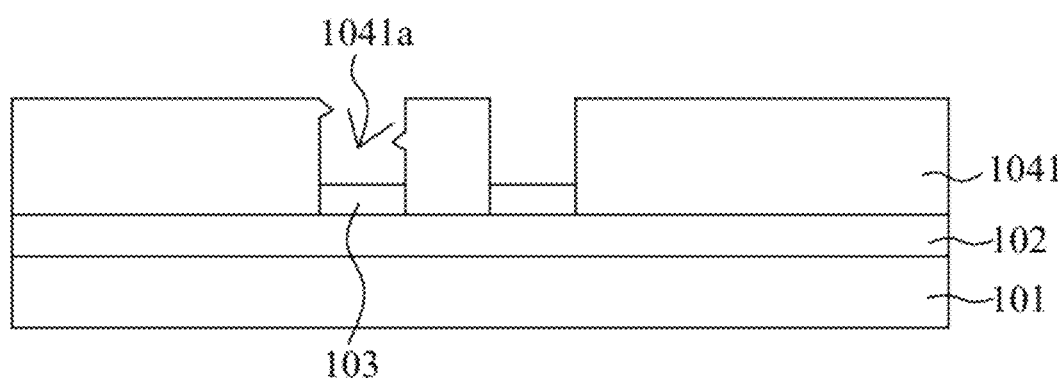
Figure 3E:
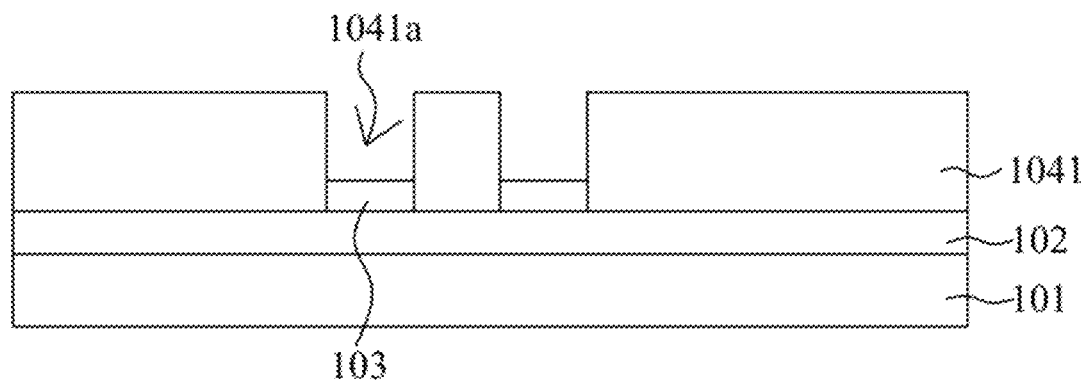

Specifically, the developing solution is used to develop the ink layer 104 irradiated by the first light L1 with the first preset wavelength and the second light L2 of the second preset wavelength to remove the uncured ink layer 104 in the preset area 104a. The ink layer 104 is then baked to obtain a patterned ink layer 1041. The patterned ink layer 1041 is defined with an opening 1041a located in the preset area 104a, and the opening 1041a exposes the conductive pad 103, as shown in FIG. 3D. Then, the sidewalls of the openings 1041a are cleaned with a brush or ultrasonic waves and a cleaning solution to remove the burrs on the sidewalls of the patterned ink layer 1041, as shown in FIG. 3E.

It should be noted that, while using the first light L1 with the first preset wavelength to pass through the first light-transmitting area 201a of the first mask 201 from the first side to irradiate the ink layer 104 outside the preset area 104a, the ink layer 104 outside the preset area 104a is heated from the second side by using the second light L2 of the second preset wavelength to pass through the second light-transmitting area 202a of the second mask 202. This will cause the local area of the ink layer 104 outside the preset area 104a to react too quickly, causing a small amount of the ink layer in the preset area 104a to be cured, and this area cannot be removed by the developer. The final residue is the burr on the sidewall of the patterned ink layer 1041. The cleaning process is used to remove the burr, which is beneficial to avoid the burr falling on the conductive pads 103 in the subsequent process and affecting the bonding of the subsequent light-emitting elements 106.

S500, bonding the light-emitting unit on the conductive pad to obtain a light-emitting substrate.

Figure 3F:
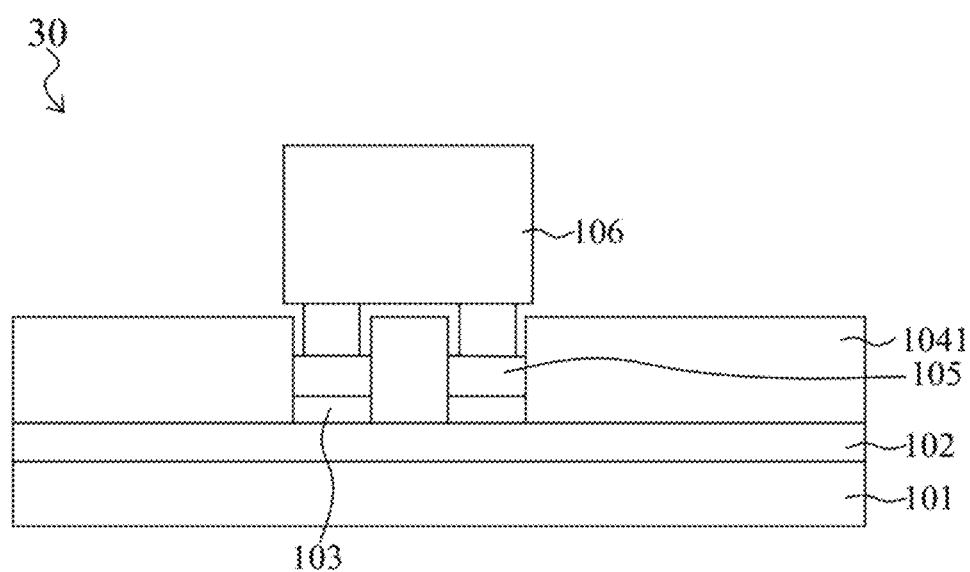

Specifically, a stencil is used to print solder paste 105 on the conductive pad 103, and the light-emitting element 106 is bonded on the solder paste 105 to obtain a light-emitting substrate 30, as shown in FIG. 3F.

Wherein, the light-emitting element 106 is selected from any of micro light-emitting diodes or sub-millimeter light-emitting diodes.

The present application further provides a light-emitting substrate, which is produced by the aforesaid manufacturing method.

The descriptions of the aforesaid embodiments are only used to help understand the technical solutions and core ideas of the present application. One of ordinary skill in the art should understand that it is still possible to modify the technical solutions recited in the foregoing embodiments or perform equivalent replacements to some of the technical features. However, these modifications or replacements do not make the essence of the technical solutions deviate from the scope of the technical solutions of the embodiments of the present application.

What is claimed is:

1. A manufacturing method of a light-emitting substrate, comprising:
providing an array substrate comprising a substrate and a conductive pad disposed on the substrate;
forming an ink layer covering the conductive pad and the substrate, wherein the ink layer is defined with a preset area corresponding to a position of the conductive pad, wherein the ink layer is a white ink layer, and a thickness of the ink layer is greater than or equal to 40 μm and less than or equal to 70 μm;
irradiating the ink layer outside the preset area from a first side by light with a first preset wavelength while heating the ink layer outside the preset area from a second side, wherein the first side is one of a side of the substrate away from the ink layer and a side of the ink layer away from the substrate, and the second side is another one of the side of the substrate away from the ink layer and the side of the ink layer away from the substrate, wherein the first side and the second side are opposite sides;
removing the ink layer in the preset area to obtain a patterned ink layer; and
bonding a light-emitting unit on the conductive pad to obtain the light-emitting substrate.

2. The manufacturing method of the light-emitting substrate of claim 1, wherein the substrate is transparent, and wherein the step of heating the ink layer outside the preset area from the second side comprises:
irradiating the ink layer outside the preset area from the second side by light with a second preset wavelength, wherein the second side is the side of the substrate away from the ink layer.

3. The manufacturing method of the light-emitting substrate of claim 2, wherein the light with the first preset wavelength is same as the light with the second preset wavelength.

4. The manufacturing method of the light-emitting substrate of claim 3, wherein the first preset wavelength is greater than or equal to 365 nm and less than or equal to 450 nm, and the light with the first preset wavelength and the light with the second preset wavelength are both laser light.

5. The manufacturing method of the light-emitting substrate of claim 2, wherein the light with the first preset wavelength is different from the light with the second preset wavelength, and the first preset wavelength is shorter than the second preset wavelength.

6. The manufacturing method of the light-emitting substrate of claim 5, wherein the light with the first preset wavelength is laser light, and the light with the second preset wavelength is infrared light.

7. The manufacturing method of the light-emitting substrate of claim 1, wherein after removing the ink layer in the preset area and before bonding the light-emitting unit on the conductive pad, the method further comprises:
cleaning the patterned ink layer.

8. The manufacturing method of the light-emitting substrate of claim 1, wherein after forming the ink layer covering the conductive pad and the substrate and before irradiating the ink layer outside the preset area from the first side by the light with the first preset wavelength, the method further comprises:
removing a solvent in the ink layer.

9. A manufacturing method of a light-emitting substrate, comprising:
providing an array substrate comprising a substrate and a conductive pad disposed on the substrate;
forming an ink layer covering the conductive pad and the substrate, wherein the ink layer is defined with a preset area corresponding to a position of the conductive pad;
irradiating the ink layer outside the preset area from a first side by light with a first preset wavelength while heating the ink layer outside the preset area from a second side, wherein the first side is one of a side of the substrate away from the ink layer and a side of the ink layer away from the substrate, and the second side is another one of the side of the substrate away from the ink layer and the side of the ink layer away from the substrate, wherein the first side and the second side are opposite sides;
removing the ink layer in the preset area to obtain a patterned ink layer; and
bonding a light-emitting unit on the conductive pad to obtain the light-emitting substrate.

10. The manufacturing method of the light-emitting substrate of claim 9, wherein the substrate is transparent, and wherein the step of heating the ink layer outside the preset area from the second side comprises:
irradiating the ink layer outside the preset area from the second side by light with a second preset wavelength, wherein the second side is the side of the substrate away from the ink layer.

11. The manufacturing method of the light-emitting substrate of claim 10, wherein the light with the first preset wavelength is same as the light with the second preset wavelength.

12. The manufacturing method of the light-emitting substrate of claim 11, wherein the first preset wavelength is greater than or equal to 365 nm and less than or equal to 450 nm, and the light with the first preset wavelength and the light with the second preset wavelength are both laser light.

13. The manufacturing method of the light-emitting substrate of claim 10, wherein the light with the first preset wavelength is different from the light with the second preset wavelength, and the first preset wavelength is shorter than the second preset wavelength.

14. The manufacturing method of the light-emitting substrate of claim 13, wherein the light with the first preset wavelength is laser light, and the light with the second preset wavelength is infrared light.

15. The manufacturing method of the light-emitting substrate of claim 9, wherein after removing the ink layer in the preset area and before bonding the light-emitting unit on the conductive pad, the method further comprises:
cleaning the patterned ink layer.

16. The manufacturing method of the light-emitting substrate of claim 9, wherein the ink layer is a white ink layer.

17. The manufacturing method of the light-emitting substrate of claim 9, wherein a thickness of the ink layer is greater than or equal to 40 μm and less than or equal to 70 μm.

18. The manufacturing method of the light-emitting substrate of claim 9, wherein after forming the ink layer covering the conductive pad and the substrate and before irradiating the ink layer outside the preset area from the first side by the light with the first preset wavelength, the method further comprises:
removing a solvent in the ink layer.

19. A light-emitting substrate, produced by the manufacturing method of the light-emitting substrate of claim 9.

* * * * *